(12) United States Patent
Ito et al.

(10) Patent No.: US 7,381,464 B2
(45) Date of Patent: *Jun. 3, 2008

(54) DIELECTRIC CERAMIC COMPOSITION AND ELECTRONIC DEVICE

(75) Inventors: Kazushige Ito, Chuo-ku (JP); Akira Sato, Chuo-ku (JP)

(73) Assignee: TDK Corporation, Tokyo (JP)

( * ) Notice: Subject to any disclaimer, the term of this patent is extended or adjusted under 35 U.S.C. 154(b) by 327 days.

This patent is subject to a terminal disclaimer.

(21) Appl. No.: 11/288,319

(22) Filed: Nov. 29, 2005

(65) Prior Publication Data

US 2006/0116273 A1    Jun. 1, 2006

(30) Foreign Application Priority Data

Nov. 30, 2004   (JP)   ............................. 2004-346846

(51) Int. Cl.
 *B32B 5/66*   (2006.01)
(52) U.S. Cl. ...................... 428/402; 428/403; 428/404; 428/405; 428/406
(58) Field of Classification Search ................ 428/402, 428/403, 404, 405, 400
See application file for complete search history.

(56) References Cited

U.S. PATENT DOCUMENTS

| | | | |
|---|---|---|---|
| 5,335,139 A | 8/1994 | Nomura et al. | |
| 2002/0074154 A1 | 6/2002 | Kim et al. | |

FOREIGN PATENT DOCUMENTS

| | | |
|---|---|---|
| EP | 0 504 756 A1 | 9/1992 |
| EP | 0 877 399 A2 | 11/1992 |
| EP | 0877399 A2 * | 11/1998 |
| EP | 1 094 477 A2 | 4/2001 |
| EP | 1 612 816 A1 | 1/2006 |
| JP | A 04-292458 | 10/1992 |
| JP | A 04-292459 | 10/1992 |
| JP | A 04-295048 | 10/1992 |
| JP | A 05-109319 | 4/1993 |
| JP | A 06-243721 | 9/1994 |
| JP | A 09-40465 | 2/1997 |
| JP | A 10-25157 | 1/1998 |
| JP | A 10-308321 | 11/1998 |
| JP | 2000-154057 * | 6/2000 |
| JP | A 2000-154057 | 6/2000 |
| JP | A 2001-192264 | 7/2001 |
| JP | A 2002-255639 | 9/2002 |
| JP | A 2003-48774 | 2/2003 |

* cited by examiner

*Primary Examiner*—Leszek Kiliman
(74) *Attorney, Agent, or Firm*—Oliff & Berridge, PLC

(57) ABSTRACT

An object of the invention is to provide a multilayer ceramic capacitor having high dielectric constant, good temperature characteristic, and an improved IR temperature dependency.

According to the present invention, a capacitor device body 10, wherein dielectric layers 2 comprising dielectric ceramic composition and internal electrode layers 3 are alternately laminated, characterized in that said dielectric ceramic composition comprises a plural number of crystal particles 2a wherein said crystal particles 2a form Ca dispersing area 25a wherein at least said Ca is dispersed from the surface to inside of crystal particles, and when considering crystal particles 2a having an average particle diameter of D50, an average depth T of said Ca dispersing area is controlled within a range of 10 to 30% with respect to the average particle diameter of D50, is provided.

9 Claims, 5 Drawing Sheets

DIELECTRIC CERAMIC COMPOSITION AND ELECTRONIC DEVICE

BACKGROUND OF THE INVENTION

1. Field of the Invention

The present invention relates to a dielectric ceramic composition having reduction-resistance, and an electronic device, such as a multilayer ceramic capacitor using the dielectric ceramic composition.

2. Description of the Related Art

Multilayer ceramic capacitor as an electronic device is required to have a high relative dielectric constant, a long lifetime of insulation resistance (IR), and a good DC bias characteristic, i.e. less relative dielectric constant change over time, and further, a good temperature characteristic. Particularly, depending on a purpose of use, temperature characteristic is required to be stable under a severe condition. Recently, multilayer ceramic capacitor is used in various kinds of electric devices, such as engine electronic control unit (ECU) loaded in the engine room, crank angle sensor, antilock break system (ABS) module, and so on. These electronic devices are used for a stable engine control, drive control and break control. Therefore, temperature stability of circuit is required to be good.

It can be expected that temperature of an environment wherein said electronic devices are used will drop to around −20° C. or less at cold districts in winter time, and further, after starting the engine, the temperature will rise to around 130° C. or more in summer time. Recently, there is a tendency to reduce wire harness which tie an electronic device to its control device, and that electronic devices may be set outside the car and environments of electric devices are becoming more severe. Therefore, capacitor used for said electric devices is required to have a stable temperature characteristic within a wide temperature range. Concretely, dielectric ceramic composition wherein temperature characteristic of the capacitance is required not only to satisfy X7R characteristic (−55 to 125° C., ΔC/C=within ±15%) of EIA standard, but to satisfy X8R characteristic (−55 to 150° C., ΔC/C=within ±15%) of EIA standard.

Some proposals were give for dielectric ceramic compositions those satisfy X8R characteristic.

The patent article 1 (the Japanese Unexamined Patent Publication No. H10-25157) and the patent article 2 (the Japanese Unexamined Patent Publication No. H09-40465) disclose a proposal to satisfy X8R characteristic by substituting Ba of $BaTiO_3$ with Bi, Pb or so and shift Curie temperature to a higher temperature. Further, a proposal to satisfy X8R characteristic by selecting a composition of $BaTiO_3+CaZrO_3+ZnO+Nb_2O_5$ is further disclosed. (the patent article 3 (Japanese Unexamined Patent Publication No. H04-295048), the patent article 4 (Japanese Unexamined Patent Publication No. H 04-292458), the patent article 5 (Japanese Unexamined Patent Publication No. H04-292459), the patent article 6 (Japanese Unexamined Patent Publication No. H05-109319), the patent article 7 (Japanese Unexamined Patent Publication No. H06-243721))

However, since any of said composition uses Pb, Bi, and Zn that are likely to evaporate and fly, it is necessary to fire in an oxidizing atmosphere such as air. Therefore, there is a problem that an inexpensive base metal such as Ni cannot be used in inner electrode of capacitor, and an expensive precious metal such as Pd, Au, and Ag must be used in said inner electrode.

To overcome the problems, the applicant has already proposed the below-mentioned dielectric ceramic composition with an object to provide a high dielectric constant, a satisfactory X8R characteristic, and to be able to fire in a reduced atmosphere. (the patent article 8 (Japanese Unexamined Patent Publication No. 2000-154057).

Dielectric ceramic composition as described in the Patent Article 8 at least comprises $BaTiO_3$ as main component, the first subcomponent selected at least one kind from MgO, CaO, BaO, SrO and $Cr_2O_3$, the second subcomponent expressed by $(Ba, Ca)_xSiO_{2+x}$, (note X=0.8 to 1.2), the third subcomponent selected at least one kind from $V_2O_5$, $MoO_3$, and $WO_3$, and the fourth subcomponent comprising R1 oxide (Note R1 is selected at least one kind from Sc, Er, Tm, Yb and Lu), and ratios of the respective subcomponents with respect to 100 moles of said main component are the first subcomponent: 0.1 to 3 moles, the second subcomponent: 2 to 10 moles, the third subcomponent: 0.01 to 0.5 mole, the fourth subcomponent: 0.5 to 7 moles (note that the number of moles of the fourth subcomponent is a ratio of R1 alone).

Further, the applicant already has proposed below-mentioned dielectric ceramic composition (the patent article 9 (Japanese Unexamined Patent No. 2001-192264)).

Dielectric ceramic composition as described in the Patent Article 9 at least comprises Barium Titanate as main component, the first subcomponent selected at least one kind from MgO, CaO, BaO, SrO and $Cr_2O_3$, the second subcomponent comprising silicon oxide as main component, the third subcomponent selected at least one kind from $V_2O_5$, $MoO_3$, and $WO_3$, the fourth subcomponent comprising R1 oxide (Note R1 is selected at least one kind from Sc, Er, Tm, Yb and Lu), and the fifth subcomponent comprising $CaZrO_3$ or $CaO+ZrO_2$, and ratios of the respective subcomponents with respect to 100 moles of said main component are the first subcomponent: 0.1 to 3 moles, the second subcomponent: 2 to 10 moles, the third subcomponent: 0.01 to 0.5 mole, the fourth subcomponent: 0.5 to 7 moles (note that the number of moles of the fourth subcomponent is a ratio of R1 alone), the fifth subcomponent: 0<the fifth subcomponent≦5 moles.

However, with the dielectric ceramic compositions of said applications, it was found by the applicants that, it was difficult to satisfy X8R characteristic of the capacitance, and insurance resistance lifetime tends decrease when dielectric layer was further laminated. Considering temperature characteristic of the capacitance, capacitance change rate tends to increase particularly at higher temperature and it is expected to improve. Further, since rare-earth oxide including lanthanoide series element is expensive, inexpensive substituting element that can obtain the same characteristic has been searched. Furthermore, a tendency for integration and higher density of circuit is becoming more and more strong and a demand for a small sized mass-capacitance capacity is increasing and that inner dielectric layer is required to be more thinner.

In order to satisfy these demands, the applicants already have proposed below-mentioned dielectric ceramic composition (Patent Article 10 (Japanese Patent Article No. 2002-255639)). Dielectric ceramic composition as described in the Patent Article 10 at least comprises barium titanate as main component, the first subcomponent comprising AE oxide (Note AE is selected at least one kind from Mg, Ca, Ba and Sr), the second subcomponent comprising R oxide (Note R is selected at least one kind from Y, Dy, Ho and Er), and ratios of the respective subcomponents with respect to 100 moles of said main component are the first subcomponent: 0 mole<the first subcomponent<0.1 mole, the second subcomponent: 1 mole<the second subcomponent<7 moles.

With said patent article 10, X8R characteristic can be satisfied, however, IR temperature dependency from room temperature to higher temperature deteriorates and it was difficult to use them as a product.

Conventionally, in order to secure high dielectric constant and good temperature characteristic in dielectric ceramic composition comprising barium titanate as main component, core-shell structure having a ferroelectric phase part(core) and paraelectric phase part(shell) surrounding said core in crystal particle is thought to be useful. Various proposals have been made from the past for the core-shell structure of crystal particle.

For instance, patent article 11 (Japanese unexamined Patent Application No. 10-308321) proposes a method to control dispersing depth of Mg from the surface to the inner side of crystal particle within a fixed range, by adding Mg as a subcomponent to barium titanate as a main component and adjusting the firing temperature and firing time. With this method, dielectric ceramic composition having sufficiently high dielectric constant and good temperature characteristic can be obtained and quality level of multilayer ceramic capacitor can be improved.

With the method of the patent article 11, dielectric constant was high and temperature characteristic was good to 125° C., however, bad to 150° C. and IR temperature dependency from room temperature to higher temperature deteriorates and it was difficult to use them as a product.

Further, dielectric ceramic composition wherein Ca is added and as a subcomponent to main component of barium titanate, and all of said Ca is solved in said main component, is well known (See Patent Article 12 (Japanese Unexamined Patent No. 2003-48774)). However, with the method of the patent article 12, since Ca is all solved in barium titanate, good temperature characteristic could not be shown even- dielectric constant was high.

SUMMARY OF THE INVENTION

An object of the present invention is to provide a dielectric ceramic composition having a high relative dielectric constant, and which can maintain insulation resistance lifetime, satisfy temperature characteristic (e.g. X8R characteristic of EIA standard (−55 to 150° C., ΔC/C=within ±15%)), be fired in an reduced atmosphere, and improved IR temperature dependency can be provided. Further object of the present invention is to provide an electric device such as multilayer ceramic capacitor, which can realize smaller-size and larger capacitance and particularly smaller-sized thin layer.

In order to achieve said objects, according to the present invention,
dielectric ceramic composition comprising a main component including barium titanate, and a subcomponent including at least Mg and Ca, characterized in that a plural number of crystal particles are included in the dielectric ceramic composition,
said crystal particles are provided with Ca dispersing area wherein at least said Ca is dispersed from the surface to inside of crystal particles,
and when considering crystal particles having an average particle diameter of D50, an average depth T of said Ca dispersing area is controlled within a range of 10 to 30% with respect to the average particle diameter of D50.

According to the present invention,
main component including barium titanate
a first subcomponent selected at least one kind from MgO, CaO, BaO and SrO,
a second subcomponent comprising silicone oxide as main component,
a third subcomponent comprising at least one kind from $V_2O_5$, $MoO_3$ and $WO_3$,
a fourth subcomponent comprising R1 oxide (Note R1 is selected at least one kind from Sc, Er, Tm, Yb, and Lu),
a fifth subcomponent comprising $CaZrO_3$ or $CaO+ZrO_2$,
a sixth subcomponent comprising R2 oxide (Note R2 is selected at least one kind from Y, Dy, Ho, Tb, Gd, and Eu), and
a seventh subcomponent comprising MnO
wherein ratios of the respective subcomponents with respect to 100 moles of said main component are
the first subcomponent: 0.1 to 3 moles,
the second subcomponent: 2 to 10 moles,
the third subcomponent: 0.01 to 0.5 mole,
the fourth subcomponent: 0.5 to 7 moles (note that the number of moles of the fourth subcomponent is a ratio of R1 alone),
the fifth subcomponent: 0<the fifth subcomponent≦5 moles,
the sixth subcomponent: 9 moles or less (note that the number of moles of the sixth subcomponent is a ratio of R2 alone),
the seventh subcomponent: 0.5 mole or less, and
said crystal particles are formed with Ca dispersing area wherein at least said Ca is dispersed from the surface to inside of crystal particles,
and when considering crystal particles having an average particle diameter of D50, an average depth T of Ca dispersing area is controlled within a range of 10 to 30% with respect to the average particle diameter of D50.

According to the present invention,
main component including barium titanate,
a first subcomponent comprising AE oxide (note AE is selected at least one kind from Mg, Ca, Ba, and Sr),
a second subcomponent comprising R oxide (note R is selected at least one kind from Y, Dy, Tm, Ho, and Er),
a third subcomponent comprising $MxSiO_3$ (note M is selected at least one kind from Ba, Ca, Sr, Li, B and when M=Ba, X=1, when M=Ca, X=1, when M=Sr, X=1, when M=Li, X=2, when M=B, X=⅔ respectively),
a fourth subcomponent comprising MnO,
a fifth subcomponent comprising at least one kind from $V_2O_5$, $MoO_3$, and $WO_3$, and
a sixth subcomponent comprising $CaZrO_3$ or $CaO+ZrO_2$
wherein ratios of the respective subcomponents with respect to 100 moles of said main component are
the first subcomponent: 0 to 0.1 mole(note 0 mole and 0.1 mole are excluded),
the second subcomponent: 1 to 7 moles(note 1 mole and 7 moles are excluded),
the third subcomponent: 2 to 10 moles,
the fourth subcomponent: 0 to 0.5 mole (note 0 mole is excluded),
the fifth subcomponent: 0.01 to 0.5 mole,
the sixth subcomponent: 0 to 5 moles (note 0 mole and 5 moles are excluded), and
said crystal particles are provided with Ca dispersing area wherein at least said Ca is dispersed from the surface to inside of particles, and when considering crystal particles having an average particle diameter of D50, an average depth T of said Ca dispersing area is controlled within a range of 10 to 30% with respect to the average particle diameter of D50.

An electronic device according to the present invention is not particularly limited as far as it comprises a dielectric layer and is, for example, a multilayer ceramic capacitor element comprising a capacitor element body, wherein dielectric layers and internal electrode layers are alternately stacked. In the present invention, the dielectric layer is composed of the dielectric ceramic composition as set forth in any one of the above. The conductive material included in the internal electrode layer is not particularly limited and is, for example, Ni or a Ni alloy.

EFFECT OF THE INVENTION

The inventors have been investigating a particular core-shell structure, which can improve IR temperature dependency without affecting the subjected temperature characteristic (e.g. X8R characteristic). And as a result, the inventors have found that it is effective for a particular dielectric composition, which can satisfy the subjected temperature characteristic, to provide a core-shell structure, and Ca in the shell part (Ca dispersing area), and to control an average thickness of the shell (=an average depth T of Ca dispersing area) corresponding to particle diameter D50 of crystal particles. The present invention was attained by said result. Note that the inventors have also found that Mg may be included in the shell (Mg dispersing area) of the invention, however, IR temperature dependency would not be effected by said Mg dispersing area.

"IR temperature dependency" is a guideline to make sure how insulation resistance (IR) changes corresponding the temperature change. This IR temperature dependency can be valued by calculating IR change rate at a predetermined temperature such as 150° C. with respect to IR at a reference temperature, such as room temperature of 25° C.

It can be determined that the smaller the IR change rate between a plural numbers of different temperatures is, the better the IR temperature dependency is. To the contrary, the larger the change rate is, the worth the IR temperature dependency is. Even temperature characteristic of capacitance satisfies X8R of EIA standard, if IR temperature dependency deteriorates within a temperature range of X8R (particularly from room temperature to high temperature), it was difficult to use them as a product.

In the present invention, room temperature (25° C.) and high temperature (150° C.) are exemplified as said plural numbers of temperatures and insurance resistances of said temperatures are respectively shown as $IR_{25}$ and $IR_{150}$. Here, IR temperature dependency is valued by calculating "IR changing ratio" by the following formula 1).

$$\text{Log}(IR_{150}/IR_{25}) \quad \text{formula (1)}$$

In the present invention, dielectric composition having high relative dielectric constant and satisfy subjective temperature characteristic such as X8R characteristic is made to include a particular core-shell structure. Therefore, dielectric ceramic composition of the invention not only satisfies the subjective temperature characteristic but show small IR temperature dependency from room temperature (25° C.) to high temperature (150° C.). Concretely, IR changing ratio obtained by said formula (1) can be −2.00 or more.

Since dielectric ceramic composition of the invention has high relative dielectric constant and its temperature characteristic of the capacitance can satisfy X8R characteristic of EIA standard, electric devices comprising dielectric ceramic composition of the invention, such as ceramic tip capacitor may suitably used in an environment which may be exposed to a high temperature such as car engine room.

Further, dielectric ceramic composition of the invention does not comprise Pb, Bi, or Zn that are likely to evaporate and fly. Therefore, it can be fired in the reduced atmosphere.

Namely, according to the present invention, dielectric ceramic composition having a high relative dielectric constant, and which can maintain insulation resistance lifetime, satisfy temperature characteristic (e.g. X8R characteristic of EIA standard (−55 to 150° C., ΔC/C=within ±15%)), be fired in an reduced atmosphere, and improve IR temperature dependency can be provided.

When manufacturing electric device using dielectric ceramic composition of the invention such as ceramic tip capacitor, base metals such as Ni or Ni alloys can be used as inner electrode and that an inexpensive electric device realizes. Further, even said dielectric ceramic composition is fired in a reduced atmosphere, obtained electric device satisfies subjective temperature characteristic such as X8R characteristic, shows good capacitance aging characteristic by a direct electric field impression (=Only a small capacitance changing can be seen over time), and shows small deterioration of insulation resistance and superior reliability.

Namely, an electric device comprising dielectric ceramic composition of the invention such as multilayer ceramic capacitor can stably operate in various devices used in severe environment such as electric car equipment. Therefore, reliability of said various devices remarkably improve.

From above, present invention can also be expected to control the deterioration of temperature change rate at higher temperature due to lamination of dielectric layer.

Further, dielectric ceramic composition of the present invention has a long lifetime of insulation resistance, and further, stable DC bias characteristic (direct current voltage impression dependency of dielectric constant) and TC bias characteristic (temperature characteristic of the capacitance when impressing direct current voltage.

Furthermore, dielectric ceramic composition of the invention does not comprise toxic substance such as Pb or Bi. Therefore, environmental harmful effect such as by disposals after use is small.

Therefore, by using the dielectric ceramic composition of the invention, electric device such as multilayer ceramic capacitor having superior characteristics can be provided. Further, by using the dielectric ceramic composition of the invention, even dielectric layer is laminated, subjective temperature characteristic such as X8R characteristic can be satisfied, and decline of an insulation resistance lifetime can be effectively prevented. Therefore, with an electric device such as multilayer ceramic capacitor, smaller-size and larger capacitance can be realized, and particularly, smaller-sized thin layer can easily be obtained. Accordingly, said electric device can easily be implemented in a high-integrated circuit.

With conventional dielectric ceramic composition, according to the lamination of one layer of dielectric layers, temperature characteristic of the capacitance at high temperature tends to deteriorate. Namely, with said conventional dielectric ceramic composition, a curve showing temperature of the capacitance change rate at high temperature tends to face toward clockwise. To the contrary, with the invention, the curve showing temperature of the capacitance change rate at high temperature can face toward counterclockwise. If this phenomenon is applied to an electric device that satisfied X7R characteristic, a layer of dielectric layers can further be laminated compared to the conventional method.

The electronic device according to the present invention is not particularly limited and a multilayer ceramic capacitor, piezoelectric element, chip inductor, chip varistor, chip thermister, chip resistance and other surface mounted (SMD) chip type electronic device, etc. may be mentioned.

BRIEF DESCRIPTION OF THE DRAWINGS

These and other objects and features of the present invention will become clearer from the following description of the preferred embodiments given with reference to the attached drawings, in which.

DESCRIPTION OF THE PREFERRED EMBODIMENT

In the present embodiment, a multilayer ceramic capacitor 1 shown in FIG. 1 will be explained as an example of an electronic device.

Multilayer Ceramic Capacitor

Figure 1:
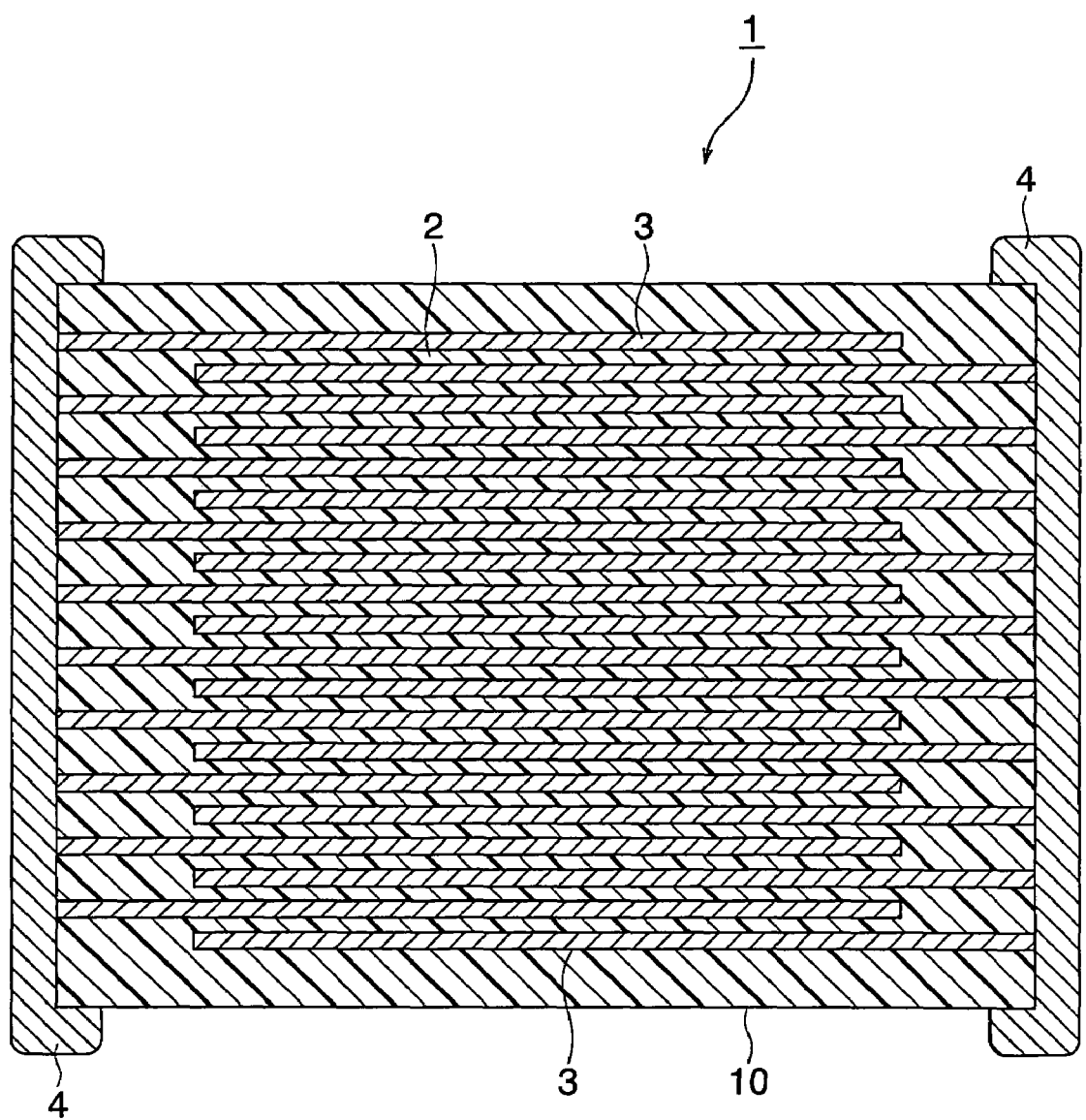
FIG. 1 is a schematic sectional view of a multilayer ceramic capacitor according to an embodiment of the present invention.

As shown in FIG. 1, the multilayer ceramic capacitor 1 as an electronic device according to an embodiment of the present invention comprises a capacitor element body 10, wherein dielectric layers 2 and internal electrode layers 3 are alternately stacked. On both end portions of the capacitor element body 10, a pair of external electrodes 4 is formed to be connected respectively to the internal electrode layers 3 alternately arranged inside the element body 10. The internal electrode layers 3 are stacked, so that each of the end surfaces is alternately exposed to surfaces of the two facing end portions of the capacitor element body 10. The pair of external electrodes 4 are formed on both end portions of the capacitor element body 10 and connected to the exposed end surfaces of the alternately arranged internal electrode layers 3 so as to compose a capacitor circuit.

An outer shape and size of the capacitor element body 10 are not particularly limited and may be suitably determined in accordance with the use object and, normally, the outer shape may be approximate rectangular parallelepiped and the size may be a length (0.4 to 5.6 mm)×a width (0.2 to 5.0 mm)×a height (0.2 to 1.9 mm) or so.

Dielectric Layer

Dielectric layer 2 comprises dielectric ceramic composition of the invention. In this embodiment, as subjective temperature characteristic, X8R characteristic (−55 to 150° C., ΔC/C=within ±15%) of EIA standard is exemplified.

The First Aspect of the Invention

Dielectric ceramic composition according to the first embodiment of the invention comprises barium titanate (preferably, expressed by a formula $Ba_mTiO_{2+m}$ wherein m=$0.995 \leq m \leq 1.010$ and a ratio of Ba and Ti is $0.995 \leq Ba/Ti \leq 1.010$) as a main component, the first subcomponent selected at least one kind from MgO, CaO, BaO and SrO, the second subcomponent comprising silicone oxide as main component, the third subcomponent comprising at least one kind from $V_2O_5$, $MoO_3$ and $WO_3$, the fourth subcomponent comprising R1 oxide (note R1 is selected at least one kind from Sc, Er, Tm, Yb, and Lu), the fifth subcomponent comprising $CaZrO_3$ or CaO+$ZrO_2$, the sixth subcomponent comprising R2 oxide (note R2 is selected at least one kind from Y, Dy, Ho, Tb, Gd, and Eu), the seventh subcomponent comprising MnO and ratios of the respective subcomponents with respect to 100 moles of said $BaTiO_3$ as main component are the first subcomponent: 0.1 to 3 moles the second subcomponent: 2 to 10 moles the third subcomponent: 0.01 to 0.5 mole the fourth subcomponent: 0.5 to 7 moles the fifth subcomponent: 0<the fifth subcomponent$\leq 5$ moles the sixth subcomponent: 9 moles or less the seventh subcomponent: 0.5 mole or less, and preferably, the first subcomponent: 0.5 to 2.5 moles the second subcomponent: 2.0 to 5.0 moles the third subcomponent: 0.1 to 0.4 mole the fourth subcomponent: 0.5 to 5.0 moles the fifth subcomponent: 0.5 to 3.0 moles the sixth subcomponent: 0.5 to 9.0 moles the seventh subcomponent: 0.01 to 0.5 mole.

Note that the number of moles of the fourth subcomponent is not a ratio of R1 oxide but a ratio of R1 alone. Namely, when Yb oxide is used for the fourth subcomponent, 1 mole of a ratio of the fourth subcomponent means 1 mole of Yb and not 1 mole of $Yb_2O_3$.

In the present specification, each oxides comprising main component and each subcomponent are expressed by stoichiometric composition but oxidized state of each oxide can be out of this range. Note that a ratio of each subcomponent is obtained by converting metal amount included in an oxide of each subcomponent to an oxide of above-mentioned mole ratio.

Comprising the first to the seventh subcomponents and maintaining high dielectric constant can satisfy X8R characteristic. Preferable amounts of the first to the seventh components and effects of those are explained below.

The first subcomponent (MgO, CaO, BaO, and SrO) has an effect to level the temperature characteristic of the capacitance. When content of the first subcomponent is too small, temperature change rate of the capacitance increases, while when too large, sintering characteristic tends to deteriorate. Note a rate of each oxide included in the first subcomponent is not limited.

The second subcomponent (comprising silicon oxide as a main component) mainly effect as an agent to help sintering, however, further has an effect to improve the defective constant of initial insulation resistance when laminating dielectric layers. When content of the second subcomponent is too small, temperature characteristic of the capacitance deteriorates and IR (insulation resistance) tends to deteriorate, while when too large, IR lifetime will be insufficient and rapid decrease of the dielectric constant occur.

The third subcomponent ($V_2O_5$, $MoO_3$ and $WO_3$) has an effect to level the temperature characteristic of the capacitance at Curie temperature or higher and to improve IR lifetime. When content of the third subcomponent is too small, said effects will be insufficient, while when too large, IR will be rapidly deteriorated. Note a rate of each oxide included in the third subcomponent is not limited.

The fourth subcomponent (R1 oxide) has an effect to shift the Curie temperature to a higher temperature and to level the temperature characteristic of the capacitance. When content of the fourth subcomponent is too small, said effects will be insufficient, while when too large, sintering characteristic tends to be deteriorated. Yb oxide is preferable for the fourth subcomponent since it has good effect on characteristic improvement and also, it is inexpensive.

The fifth subcomponent ($CaZrO_3$) has an effect to shift the Curie temperature to a higher temperature and to level the temperature characteristic of the capacitance. Further, it has an effect to improve CR product and direct dielectric breakdown strength. However, when content of the fifth subcomponent is too large, IR accelerating rapidly deteriorates and temperature characteristic of the capacitance (X8R characteristic) deteriorates.

By adjusting the amount of the fourth subcomponent (R1 oxide) and the fifth subcomponent ($CaZrO_3$), temperature characteristic (X8R characteristic) of the capacitance can be leveled, and high temperature accelerating lifetime and CR product can be improved. Particularly, within the abovementioned range, separations of different phase are controlled and the composition of the invention will be uniform. When content of the fourth subcomponent is too large, pyrochlor phase of giant acicular crystal is liable to separate and remarkable deterioration of characteristic (reduction of CR product) can be observed when dielectric layers of multilayer ceramic capacitor are laminated, while when too small, temperature characteristic of the capacitance cannot be satisfied. When content of the fifth subcomponent is too large, CR product and direct breakdown voltage (VB) will be improved, however, temperature characteristic of the capacitance deteriorates and IR accelerating lifetime will also be deteriorated.

The sixth subcomponent (R2 oxide) has an effect to improve IR and IR lifetime and does not have a bad effect for the temperature characteristic of the capacitance. However, when content of R2 oxide is too large, sintering characteristic tends to deteriorate. Y oxide is preferable for the sixth subcomponent since it has good effect on characteristic improvement and also, it is inexpensive.

The seventh subcomponent (MnO) has an effect to accelerate sintering, make IR high, and improve IR lifetime. In order to sufficiently obtain said effects, a ratio of the seventh subcomponent with respect to 100 moles of $BaTiO_3$ is 0.01 mole or more. Note, when content of the seventh subcomponent is too large, it gives bad effect to the temperature characteristic of the capacitance, therefore, it is preferably 0.5 mole or less.

preferably, the second subcomponent is selected at least one kind from $SiO_2$, MO (note M is selected one kind from Ba, Ca, Sr and Mg), $Li_2O$, and $B_2O_3$.

More preferably, the second subcomponent is expressed by $(Ba, Ca)_xSiO_{2+x}$ (note X=0.7 to 1.2). BaO and CaO as in preferable embodiment [$(Ba, Ca)_xSiO_{2+x}$] of the second subcomponent are also included in the first subcomponent, however, since complex oxide of $(Ba, Ca)_xSiO_{2+x}$ has a low melting point and has good reaction toward main component, BaO and/or CaO is preferably added as said complex oxide. "X" as in $(Ba, Ca)_xSiO_{2+x}$ which is a preferable embodiment of the second subcomponent is preferably 0.7 to 1.2, more preferably, 0.8 to 1.1. When "x" is too small, namely, when $SiO_2$ is too large, said complex oxide react with the main component $BaTiO_3$ and deterioration occur in dielectric characteristic, while when too large, since melting point increases and sintering characteristic deteriorates, it is not preferable. Note a ratio of Ba and Ca is not limited and it may be possible to include only one of them.

Total content of the fourth and sixth subcomponents is, with respect to 100 moles of $BaTiO_3$ as a main component, preferably 13 moles or less, more preferably 10 moles or less (note that the number of moles of the fourth subcomponent and the sixth subcomponent is respectively a ratio of R1 and R2 alone). This is limited to maintain good sintering characteristic.

The Second Aspect of the Invention

Dielectric ceramic composition according to the second embodiment of the invention comprises barium titanate (preferably, expressed by a formula $Ba_mTiO_{2+m}$ wherein m=0.995≦m≦1.010 and a ratio of Ba and Ti is 0.995≦Ba/Ti≦1.010) as a main component, the first subcomponent comprising AE oxide (note AE is selected one kind from Mg, Ca, Ba, and Sr), the second subcomponent comprising R oxide (note R is selected one kind from Y, Dy, Tm, Ho, and Er), the third subcomponent comprising $M_xSiO_3$ (note M is selected one kind from Ba, Ca, Sr, Li and B, and when M=Ba, x=1, when M=Ca, x=1, when M=Sr, x=1, when M=Li, X=2, and when M=B, x=⅔), the fourth subcomponent comprising MnO, the fifth subcomponent comprising at least one kind from $V_2O_5$, $MoO_3$ and $WO_3$, and the sixth subcomponent comprising $CaZrO_3$ or CaO+$ZrO_2$.

The first subcomponent has an effect to level the temperature characteristic of the capacitance.

The second subcomponent has an effect to shift its Curie temperature to a higher temperature and to level the temperature characteristic of the capacitance.

The third subcomponent mainly effect as an agent to help sintering, however, further has an effect to improve the defective constant of initial insulation resistance when laminating dielectric layers.

The fourth subcomponent has an effect to accelerate sintering, make IR high, and improve IR lifetime.

The fifth subcomponent has an effect to level the temperature characteristic of the capacitance at Curie temperature or higher and to improve IR lifetime.

The sixth subcomponent has an effect, other than to shift Curie temperature to a higher temperature, to improve insulation resistance (IR), to improve breakdown voltage, decrease firing temperature, and so on.

X8R characteristic can be satisfied and a high dielectric constant can be maintained by comprising abovementioned first to sixth subcomponents. Preferable amounts of the first to the sixth components and effects of those are explained below.

A ratio of the first subcomponent with respect to 100 moles of the main component is 0 to 0.1 mole (note 0 mole and 0.1 mole are excluded), preferably 0.01 to 0.1 mole (note 0.1 mole is excluded), more preferably, 0.04 to 0.08 mole.

A ratio of the second subcomponent with respect to 100 moles of the main component is 1 to 7 moles (note 1 mole and 7 moles are excluded), preferably 1 to 6 moles (note 1 mole is excluded), more preferably, 3 to 5 moles.

A ratio of a mole number of the second subcomponent to a mole number of the first subcomponent is (the second subcomponent/the first subcomponent) is preferably 10 to 500 (note 10 and 500 are excluded), more preferably 37.5 to 250, and more preferably, 37.5 to 125.

A ratio of the third subcomponent with respect to 100 moles of the main component is preferably 2 to 10 moles, and more preferably 2 to 6 moles.

A ratio of the fourth subcomponent with respect to 100 moles of the main component is preferably 0 to 0.5 mole (note 0 mole is excluded), more preferably, 0.1 to 0.5 mole.

A ratio of the fifth subcomponent with respect to 100 moles of the main component is preferably 0.01 to 0.5 mole, more preferably, 0.01 to 0.2 mole.

A ratio of the sixth subcomponent with respect to 100 moles of the main component is preferably 0 to 5 moles (note 0 mole and 5 moles are excluded), more preferably, 0 to 3 moles (note 0 mole is excluded).

In the present specification, each oxides comprising main component and each subcomponent are expressed by stoichiometric composition but oxidized state of each oxide can be out of this range. Note that a ratio of each subcomponent is obtained by converting metal amount included in an oxide of each subcomponent to an oxide of above-mentioned mole ratio.

Reasons for limiting the content of each subcomponent will be described below.

When content of the first subcomponent is too small, said effects will be insufficient and temperature characteristics of the capacitance deteriorate on the whole, while when said amount exceeds the range of the invention, temperature characteristic of the capacitance at higher temperature tends to deteriorate again.

When content of the second subcomponent is too small, said effects will be insufficient and temperature characteristics of the capacitance deteriorate, while when too large, sintering characteristic rapidly deteriorate. Particularly, by limiting the content of the first subcomponent as low as possible, while determining that of the second subcomponent as large as possible, temperature characteristic of the capacitance may further be leveled.

When a ratio (the second subcomponent/the first subcomponent) of a mole number of the first subcomponent to a mole number of the second subcomponent is too small, temperature characteristic of the capacitance tends to deteriorate and X8R characteristic cannot be satisfied, when too large, firing characteristic tends to deteriorate.

Note when content of the third subcomponent is too small, there is a tendency that the temperature characteristic of the capacitance cannot be satisfied, insulation resistance deteriorate, and sintering characteristic remarkably deteriorate, while too large, lifetime characteristic of the insulation resistance become insufficient, and there is a tendency that the dielectric constant rapidly decreases. Note a rate of each oxide included in the third subcomponent is not limited.

When content of the fourth subcomponent is too large, it provides bad effect to the temperature characteristic of the capacitance and IR lifetime may be deteriorated.

When content of the fifth subcomponent is too small, there is a tendency that said effects become insufficient, while too large, IR rapidly decreases. Note a rate of each oxide included in the fifth subcomponent is not limited.

When content of the sixth subcomponent is too large, IR lifetime rapidly deteriorates and temperature characteristic of the capacitance tends to deteriorate.

In both the first and the second embodiments of the invention, forms of $CaZrO_3$ when adding is not particularly limited, and Ca oxides such as CaO, carbonate such as $CaCO_3$, organic compounds, and $CaZrO_3$ can be exemplified. A ratio of Ca and Zr is not particularly limited and it can be determined in order not to be dissolved in main component of $BaTiO_3$. A mole ratio of Ca to Zr (Ca/Zr) is preferably 0.5 to 1.5, more preferably 0.8 to 1.5, and the most preferably 0.9 to 1.1.

Note when at least one kind from Sr, Zr, and Sn substitute Ba or Ti as in main component comprising perovskite structure, Curie temperature shift to a lower temperature causing deterioration of temperature characteristic of the capacitance at 125° C. or more. Therefore, it is preferable not to use $BaTiO_3$ comprising said elements [such as (Ba, Sr)$TiO_3$] as main component. However, there will be no problem if content is only considered to be impurities, i.e. approximately 0.1 mole % or less with respect to entire dielectric ceramic composition.

Curie temperature (phase transition temperature from ferroelectric to paraelectric) of dielectric ceramic composition of the invention may be varied by selecting the compositions. However, in order to satisfy X8R characteristic, said Curie temperature is preferably 120° C. or more and more preferably 123° C. or more. Note, Curie temperature can be measured using DSC (differential scanning calorimetry) or so.

Multilayer ceramic capacitor using dielectric ceramic composition of the invention is suitably used for electric devices of equipments used in an environment, which is 80° C. or more, and particularly 125 to 150° C. Within said temperature range, temperature characteristic of the capacitance satisfies R characteristic of EIA standard, and further satisfies X8R characteristic. Furthermore, B characteristic of EIAJ standard [change rate of the capacitance is within ±10% (a reference temperature is 20° C.) at ±25 to 85° C.], and X7R characteristic of EIA standard [$\Delta C=\pm 15\%$ at −55 to 125° C.] can both be satisfied at the same time.

Further, if insurance resistances of room temperature (25° C.) and high temperature (150° C.) are respectively shown as $IR_{25}$ and $IR_{150}$, "IR changing ratio" shown by the following formula (1) can be −2.00 or more. Namely, IR temperature dependency is small.

$$\text{Log}(IR_{150}/IR_{25}) \qquad \text{formula (1)}$$

An alternating electric field of generally 0.02V/μm or more, particularly, 0.2V/μm or more, further, 0.5V/μm or more, generally around 5V/μm or less and a direct electric field of 5V/μm or less superposing said alternating electric field are impressed to said multilayer ceramic capacitor. Temperature characteristic of the capacitance is stable even with said electric field.

Various conditions such as a number of laminating layers or a thickness of dielectric layer 2 can suitably be determined according to an object or the use of the invention. In the present embodiment, the thickness of the dielectric layer 2 is laminated to preferably 7.5 μm or less, more preferably 4 μm or less. In the present embodiment, even when the thickness of the dielectric layer 2 is made thin as such, a variety of electric characteristics, particularly, a sufficient dielectric constant and improved IR temperature characteristic can be obtained.

Fine Structure of Dielectric Layer

Figure 2:
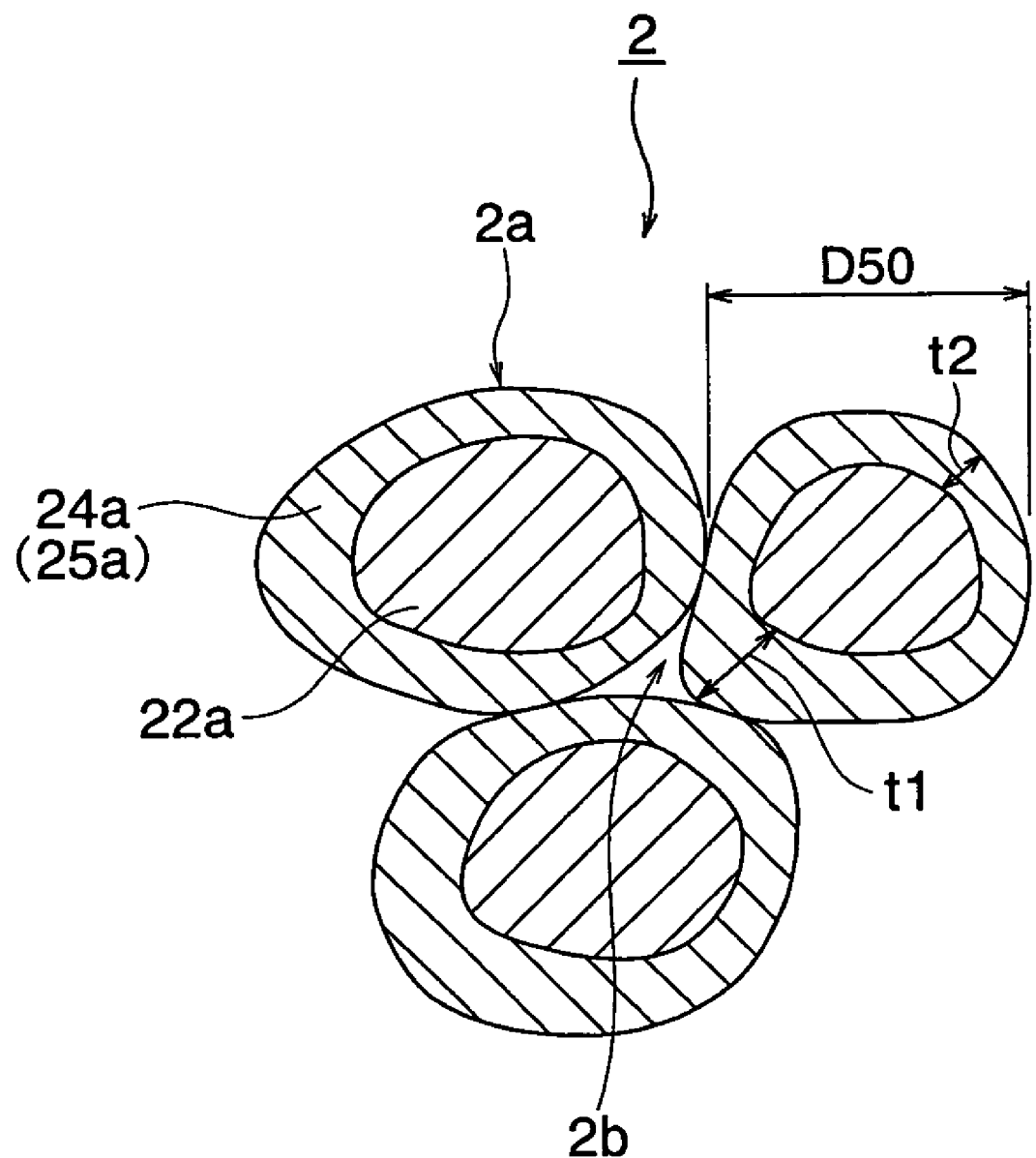
FIG. 2 is an enlarged sectional view of a key part of a dielectric layer 2 shown in FIG. 1.

As shown in FIG. 2, the dielectric layer 2 is configured to include a plurality of crystal particles (dielectric particles) 2a and particle boundary phases 2b formed between a plurality of adjacent crystal particles 2a.

The crystal particles 2a have the core-shell structure that a shell (subcomponent dispersing layer) 24a of paraelectric phase part is provided around a core (substantially composed of barium titanate) 22a as ferroelectric phase part.

The core-shell structure of the dielectric particles 2a indicates the structure that the core 22a as the center part of the dielectric particle and the shell 24a for covering the core 22a surface form physically and chemically different phases. It is considered that subcomponent elements are practically dispersed more on the particle surface side comparing with that at the center of the dielectric particle 2a and form the shell 24a.

In the present embodiment, shell 24a comprises CaO, and it is considered that the shell further comprises MgO, $R_2O_3$ (R is rear-earth element), ZrO, MnO or so. Ca dispersing area 25a wherein Ca is dispersed from a surface to inside of crystal particle 2a is formed in said shell 24a. The present embodiment exemplifies a Ca dispersing area 25a, which constitute as the shell 24a.

In the present embodiment, considering crystal particles showing an average particle diameter of D50, an average depth T (which is equal to the thickness of shell 24a of present embodiment, however, an average depth T of Ca dispersing area 25a may be smaller than a thickness of shell 24a) of CA dispersing area 25a is controlled to be within a range of 10 to 30% of D50 from a surface to center of crystal particle 2a, which has an average particle diameter of D50, and preferably within a range of 15 to 20% of D50. By forming Ca dispersing area 25a within this range, IR temperature dependency can be improved and high dielectric constant and X8R can be secured. When an average depth T of Ca dispersing area 25a is less than 10% of D50, paraelectric phase part will not be sufficiently formed and temperature characteristic and also IR temperature dependency deteriorates, while more than 30%, temperature characteristic at high temperature and IR temperature dependency deteriorates and existing amount of Ca in particle boundary become less and particle growth tend to progress, and core-shell become unstable.

Further, in the present invention, Mg may be included in shell 24a (which is Mg dispersing area), an improvement of IR temperature dependency do not depend on an average depth in Mg dispersing area.

D50 is not particularly limited in the present embodiment and suitably determined from 0.1 to 3 μm in response to the thickness of dielectric layer 2. Temperature characteristic of the capacitance tends to deteriorate as dielectric layer 2 laminates, and also as an average crystal particle diameter (D50) gets small. Therefore, when it is required to make an average crystal particle diameter smaller, it is particularly useful when said average crystal particle diameter is from 0.1 to 0.5 μm. Further, if an average crystal particle diameter is made smaller, IR lifetime will be extended and change of the capacitance under direct electric field becomes less. Viewed from these phenomenons, an average crystal particle diameter is preferably small.

An average depth T of Ca dispersing area 25a can be obtained by calculating the maximum depth t1 and the minimum depth t2 of the Ca dispersing area 25a, then, calculating an average value of those. Note the maximum depth t1 of Ca dispersing area 25a of an embodiment is normally, 0.01 to 0.1 μm, preferably 0.03 to 0.05 μm, and the minimum depth t2 is normally 0.001 to 0.009 μm, and preferably 0.003 to 0.007 μm.

Note that an average particle diameter D50 (unit: μm) of the entire dielectric particles 2a is a value obtained by cutting the capacitor element body 10 in the stacking direction of the dielectric layers 2 and the internal electrode layers 3, measuring an average area of at least 200 of the dielectric particles 2a on the section shown in FIG. 2, calculating the diameter by an equivalent circle diameter and multiplying the result with 1.5. In the present embodiment, the average particle diameter D50 of the entire dielectric particles 2a may be equal to the thickness of the dielectric layer 2 at maximum, and is preferably 25% or less of the thickness of the dielectric layer 2, and more preferably 15% or smaller.

A method of controlling an average depth T of Ca dispersing area 25a is not particularly-limited, but as mentioned below, it can be done by adjusting firing time, selecting a kind of Ca material, adjusting preliminary firing time of barium titanate material and Ca material, and a method of adding Ca material (solid-phase addition or liquid-phase addition).

Components of the particle boundary phase 2b are normally oxides of materials composing the dielectric material or internal electrode material, oxides of separately added materials and, furthermore, oxides of materials to be mixed in as impurities in the procedure.

Internal Electrode Layer

Figure 3:
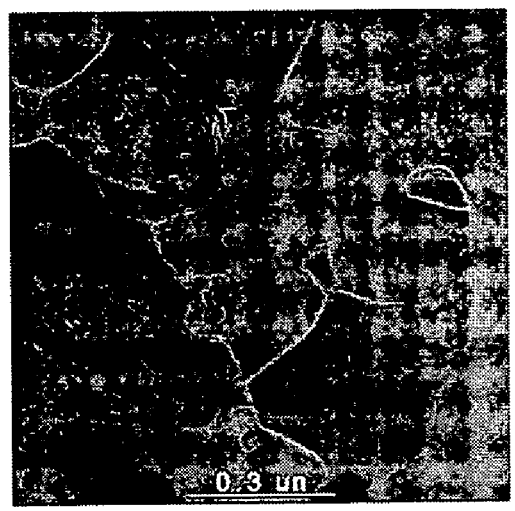
FIG. 3 is a picture of a fine structure of crystal particles corresponding to an example (sample 4) of the present invention having uniform average depth in Ca dispersing area, which is observed with TEM.

The internal electrode layers 1 shown in FIG. 3 are formed by a base metal conductive material substantially serving as an electrode. As the base metal to be used as the conductive material, Ni or a Ni alloy is preferable. As the Ni alloy, an alloy of one or more kinds selected from Mn, Cr, Co, Al, Ru, Rh, Ta, Re, Os, Ir, Pt and W, etc. with Ni is preferable, and a content of Ni in the alloy is preferably 95 wt % or more. Note that the Ni or the Ni alloy may contain various trace components, such as P, C, Nb, Fe, Cl, B, Li, Na, K, F and S, etc. by not more than 0.1 wt % or so. A thickness of the internal electrode layer 3 in the present embodiment is made as thin as preferably less than 2 μm, and more preferably 1.5 μm or thinner.

External Electrode

As the external electrodes 4 shown in FIG. 1, at least one kind of Ni, Pd, Ag, Au, Cu, Pt, Rh, Ru and Ir, etc. or an alloy of these may be normally used. Normally, Cu, a Cu alloy, Ni, a Ni alloy, etc., Ag, an Ag—Pd alloy and In—Ga alloy, etc. are used. A thickness of the external electrode 4 may be suitably determined in accordance with the use object and it is normally preferable to be 10 to 200 μm or so.

Production Method of Multilayer Ceramic Capacitor

Next, an example of a method of producing the multilayer ceramic capacitor 1 according to the present embodiment will be explained.

(1) In the present embodiment, a dielectric layer paste for composing a dielectric layer before firing for forming the dielectric layer 2 shown in FIG. 1 after firing, and an internal electrode layer paste for composing an internal electrode layer before firing for forming the internal electrode layer 3 shown in FIG. 1 after firing are prepared. Also, an external electrode paste is also prepared.

Dielectric Layer Paste

The dielectric layer paste is fabricated by kneading a dielectric material and an organic vehicle.

(1-1) The dielectric material used in the present embodiment includes respective materials for composing the dielectric ceramic composition explained above at predetermined composition ratios. For this purpose, a barium titanate material as the main component material and respective subcomponent materials are prepared.

Said respective subcomponent materials are prepared by classifying in Ca materials and the other materials.

As Ca materials, simple oxide (CaO), complex oxide ($CaZrO_3$, Ca—Y—Si—O), mixture ($CaO+ZrO_2$), carbonate ($CaCO_3$) are preferable, and complex oxide ($CaZrO_3$, Ca—Y—Si—O), mixture ($CaO+ZrO_2$) are more preferable. And the most preferably, added in the form of $CaZrO_3$. An average depth T of Ca dispersing area 25a varies according to a kind of Ca material.

As materials other than Ca materials, oxides of various element and compounds that become oxides by firing are used. As compounds that become oxides by firing, carbonates, nitrates, oxalates, organic metal compounds are exemplified. Not to mention, oxides and compounds that become oxides after firing can be used at a time.

An adding quantity of each material is determined to give the composition of the dielectric ceramic composition explained above after firing. Normally, each material powders having an average particle diameter of around 0.05 to 5 μm are used.

(1-2) Manufacturing method of dielectric material comprises two following methods. One is a primary adding method, wherein at least a part of each subcomponent is included in main component before pre-firing, then, rest of each subcomponent is mixed after the pre-firing to obtain dielectric material, and the other is a latter adding method, wherein none of each subcomponent is included in main component before pre-firing, and said each subcomponent is mixed after manufacturing the main component to obtain dielectric material. It is preferable to manufacture dielectric material according to the primary adding method. With this method, an average depth T of Ca dispersing area 25a can suitably controlled.

(1-3) According to the first aspect, primary firing powder is prepared by weighing a prescribed weight of $BaCo_3$, $CaCo_3$, $TiO_2$ that are initial materials of main component material and that of Ca material, and by mixing and drying the same.

Next, the prepared powder before preliminary firing is pre-fired. Preliminary firing conditions are not particularly limited but are preferable under the following conditions. Particularly according to the present embodiment, holding temperature and holding time (pre-firing time) of preliminary firing are factors to control an average depth T of the abovementioned Ca dispersing area 25a.

Said holding temperature of preliminary firing is preferably, 600° C. or more, more preferably 600 to 900° C., the most preferably, 650 to 750° C. When said preliminary firing temperature is too low, Ca does not disperse inside the particles and temperature characteristic deteriorates, while when too high, Ca disperses nearly to the center of the particles and IR temperature dependency tends to deteriorate.

Holding time of said holding temperature of preliminary firing is preferably, 2 to 8 hours, more preferably 3.5 to 7.5 hours. When the pre-firing time is too short, an average depth T of Ca dispersing area 25a tends to be shallow, while when too long, an average depth T of Ca dispersing area 25a tends to be excessively deep and as a result, shell 24a will not be observed. Either of the case cannot improve IR temperature dependency.

The other conditions of the preliminary firing are, temperature rising rate: 50 to 400° C./hour, particularly 100 to 300° C./hour, treatment atmosphere may be in air, in nitrogen or in reduced atmosphere.

(1-4) According to the second aspect, by not including Ca material when pre-firing the main component as in the first aspect of the invention, coating barium titanate material obtained by reacting the initial material of the main component with Ca material, forming thin shell on the surface of the barium titanate material particles, and then, preliminary firing according to the first aspect, pre-fired powder is formed. Namely, according to the second aspect, said Ca material may be added by liquid-phase addition. This liquid-phase addition is also able to control an average depth T of Ca dispersing area 25a.

To coat Ca material, a method of making the Ca material to a liquid-phase using organic metal or so, mixing with barium titanate of main composition and, then, performing preliminary firing is used.

(1-5) Next, after roughly pulverizing the obtained pre-fired powder with an alumina roll, etc., prescribed amount of subcomponent materials other than Ca material is weighed and added, and if required, the other subcomponent materials are added to obtain the final composition. Later, these mixed powder is mixed by a ball mill, etc. in accordance with need and dried, so that a dielectric material (powder) is obtained.

A content of each compound in the dielectric material may be determined to give the composition of the dielectric ceramic composition explained above after firing.

An average particle diameter of the dielectric material is preferably 5 μm or less, and more preferably 0.1 to 1 μm or so in a state of being yet to be a paste.

(1-6) An organic vehicle used in the embodiment of the invention includes a binder and a solvent. As the binder, a variety of normal binders, such as ethyl cellulose, polyvinyl butyral and an acrylic resin, may be used. The solvent is not particularly limited and an organic solvent, such as terpineol, butyl carbitol, acetone, toluene, xylene and ethanol, may be used.

The dielectric layer paste may be formed by kneading the dielectric material and a vehicle obtained by dissolving a water-soluble binder in water. The water-soluble binder is not particularly limited and polyvinyl alcohol, methyl cellulose, hydroxyethyl cellulose, a water-soluble acrylic resin and emulsion, etc. may be used.

An Internal Electrode Layer Paste and an External Electrode Paste

An internal electrode layer paste is fabricated by kneading the conductive material composed of the above variety of conductive metals and alloys, or a variety of oxides, organic metal compounds and resonates, etc. to be the above conductive materials after firing with the above organic vehicle.

An external electrode paste is fabricated also in the same way as that of the internal electrode layer paste.

A content of the organic vehicle in each paste is not particularly limited and may be a normal content of, for example, 1 to 5 wt % or so of the binder and 10 to 50 wt % or so of the solvent. Also, additives selected from a variety of dispersants, plasticizers, dielectrics and insulators, etc. may be included in each paste in accordance with need.

(2) Next, the dielectric layer paste including the dielectric material and the internal electrode layer paste are used to produce a green chip, wherein the dielectric layers before firing and the internal electrode layers before firing are stacked. The external electrode paste is printed or transferred to the capacitor element body 10 composed of a sintered body formed through a binder removal step, firing step and, if necessary, annealing step and fired to form the external electrodes 4, so that the multilayer ceramic capacitor 1 is produced.

Particularly, it is preferable to control firing time of the green chip suitably because it is a factor for controlling the average depth T of Ca dispersing area 25a explained above.

In the present embodiment, by holding the green chip at a firing holding temperature of preferably 1000 to 1350° C., and more preferably 1200 to 1300° C. for preferably 2 to 10 hours, and more preferably 2 to 5 hours, the value of T can be controlled to be in the suitable range explained above. When the firing holding time is short, the T value tends to become small, while when long, the T value tends to become large.

Other firing condition is a temperature raising rate of preferably 50 to 500° C./hour, and more preferably 100 to 300° C./hour. A temperature lowering rate is preferably 50 to 500° C./hour, and more preferably 200 to 300° C./hour. A firing atmosphere is preferably in a reducing atmosphere. As the atmosphere gas in a reducing atmosphere, it is preferable to use, for example, a wet mixed gas of $N_2$ and $H_2$. An oxygen partial pressure in the firing atmosphere is preferably $6 \times 10^{-8}$ to $10^{-4}$ Pa.

The multilayer ceramic capacitor 1 obtained in the present embodiment has dielectric composition satisfying X8R characteristic, dielectric layers 2 including crystal particles 2a having the core-shell structure wherein shell (subcomponent dispersing layer) 24a of paraelectric phase part is formed around core (substantially composed of barium titanate) 22a of ferroelectric phase part, and the shell 24a forms Ca dispersing area 25a where Ca is dispersed from the surface to inner side of crystal particle 2a with an average depth T as explained above. Therefore, a high dielectric constant and a preferable temperature characteristic (X8R) are obtained and, at the same time, the IR temperature characteristic is improved and reliability is also improved.

An embodiment of the present invention was explained above, but the present invention is not limited to the embodiment and may be variously embodied within the scope of the present invention.

For example, in the above embodiment, a multilayer ceramic capacitor was explained as an example of an electronic device according to the present invention, but the electronic device according to the present invention is not limited to a multilayer ceramic capacitor and may be any as far as it includes a dielectric layer composed of a dielectric ceramic composition having the above composition.

EXAMPLES

Below, the present invention will be explained based on further detailed examples, but the present invention is not limited to the examples.

Example 1

Production of Dielectric Material

First, a barium titanate material and subcomponent materials were prepared. As the barium titanate material, $BaTiO_3$ (hereinafter, also referred to as BT) having an average particle diameter of 0.25 μm was used. As the subcomponent materials, MgO, MnO, $V_2O_5$, $(Ba_{0.6}Ca_{0.4})SiO_3$ (hereinafter, also referred to as BCG), $Y_2O_3$, $Yb_2O_3$ and $CaZrO_3$ having an average particle diameter of 0.01 to 0.1 μm were used. The BCG was produced by performing wet mixing on $BaCO_3$, $CaCO_3$ and $SiO_2$ by a ball mill for 16 hours, drying, then, firing at 1150° C. in the air and, furthermore, performing wet grinding by a ball mill for 100 hours. $CaZrO_3$ was produced by performing wet mixing on $CaCO_3$ and $ZrO_3$ by a ball mill for 16 hours, drying, then, firing at 1150° C. in the air and, furthermore, performing wet grinding by a ball mill for 24 hours.

Next, these materials were weighed, so that the composition after firing becomes 0.9 mole of MgO, 0.37 mole of MnO, 0.1 mole of $V_2O_5$, 4.5 moles of BCG, 3 moles of $Y_2O_3$, 1.75 moles of $Yb_2O_3$ and 1.5 moles of $CaZrO_3$ with respect to 100 moles of BT as a main component. These weighed amounts are the final adding quantities of the subcomponents.

Next, $CaZrO_3$ was added to BT, and wet mixing by a ball mill was performed for 16 hours by using water as the solvent, so that powder before preliminary firing was prepared.

Next, preliminary firing was performed on the obtained powder before preliminary firing at 700° C. in the air for the time (0 to 10 hours) as shown in table 1.

Next, the rest of the final adding quantities of the subcomponent materials were added to the preliminarily fired powder, wet mixing by a ball mill was performed for 16 hours by using water as the solvent, and grinded by alumina ball, so that dielectric material of the final composition was prepared.

Fabrication of Pastes

Next, the obtained dielectric material was added with a polyvinyl butyral resin and an ethanol based organic solvent, mixed again with a ball mill to be a paste, so that a dielectric layer paste was obtained.

Next, 44.6 parts by weight of Ni particles, 52 parts by weight of terpineol, 3 parts by weight of ethyl cellulose and 0.4 part by weight of benzotriazole were kneaded by a triple roll to be a slurry, so that an internal electrode paste was obtained.

Production of Sintered Body

By using the obtained dielectric layer paste, a green sheet was formed on a PET film by a doctor blade method. The internal electrode paste was printed thereon by a screen printing method. Then, the green sheet to be a cover is removed from the PET film, a plurality of green sheets were stacked to be a thickness of 300 μm or so, sheets printed with the internal electrode paste were removed from the PET film and stacked by the desired number (5 in this case), furthermore, a green sheet to be a cover was stacked again and bonded with a pressure, so that a green chip was obtained. Note that a thickness of the dielectric layer in a green state was 3.5 μm at this time.

Next, the green chip was cut to be a predetermined size and subjected to binder removal processing, firing and annealing on the conditions below so as to obtain a chip sintered body. The binder removal processing condition was a temperature raising rate of 60° C./hour, holding temperature of 260° C., temperature holding time of 8 hours and atmosphere of in the air. The firing condition was a temperature raising rate of 200° C./hour, holding temperature of 1240° C., temperature holding time of 6 hours, temperature cooling rate of 200° C./hour and atmosphere of a wet mixed gas of $N_2$ and $H_2$. The annealing condition was a temperature raising rate of 200° C./hour, holding temperature of 1000° C., temperature holding time of 2 hours, temperature cooling rate of 200° C./hour and atmosphere of a wet $N_2$ gas. Note that a wetter, wherein a water temperature was 20° C., was used to wet the atmosphere gas at firing and annealing.

A size of the obtained sintered body was 3.2 mm in the length×1.6 mm in the width×0.6 mm in the height, and the number of dielectric layers between internal electrode layers was 5.

Structure of Sintered Body (Dielectric Ceramic Composition)

After processing the obtained sintered body to give a thickness of 10 μm, the sample was made still thinner by ion milling. Then, a scanning transmission electron microscope (TEM) was used for observation and it was confirmed that the sample was composed of crystal particles 2a and particle boundary phases 2b.

Average Particle Diameter D50 of Crystal Particles in Sintered Body

After polishing and etching the obtained sintered body, the polished surface was observed with a scanning electron microscope (SEM) and an average particle diameter D50 of the crystal particles was measured based on the code method by assuming that the crystal particle 2a has a spherical shape. An average value of 250 measuring points was used as the average crystal particle diameter D50. The result was 0.30 μm.

Fine Structure of Crystal Particles having Average Particle Diameter

Figure 4:
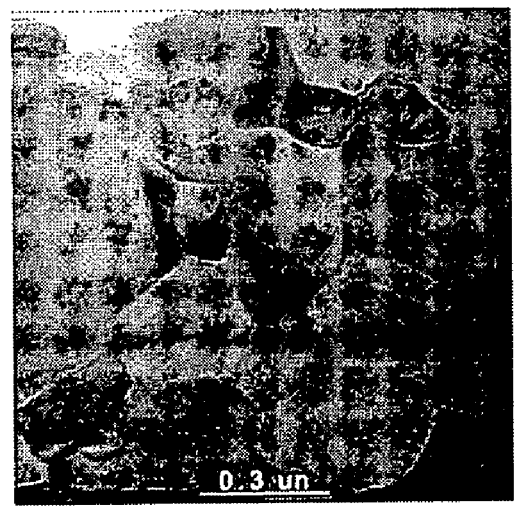
FIG. 4 is a picture of a fine structure of crystal particles corresponding to a comparative example (sample 1) of the present invention, wherein not having Ca dispersing area, which is observed with TEM.
Figure 5:
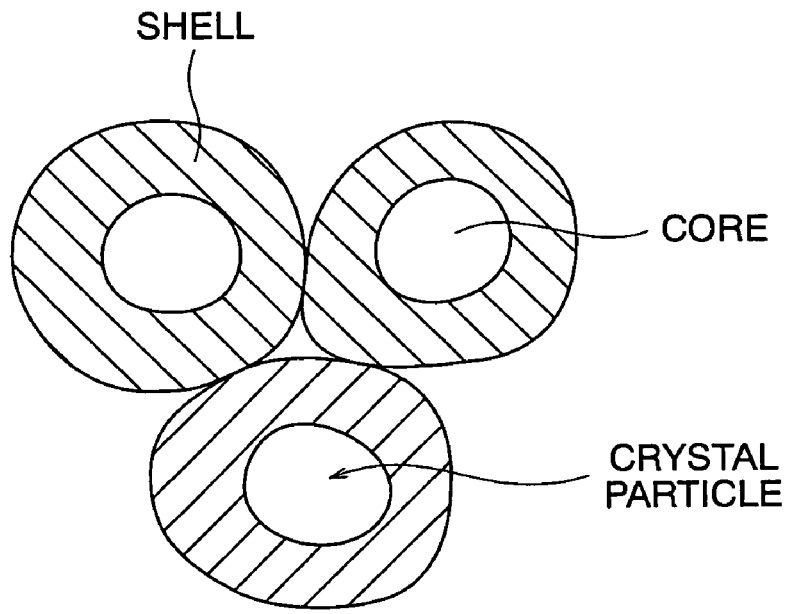
FIG. 5 is a schematic view of the TEM picture in FIG. 3.
Figure 6:
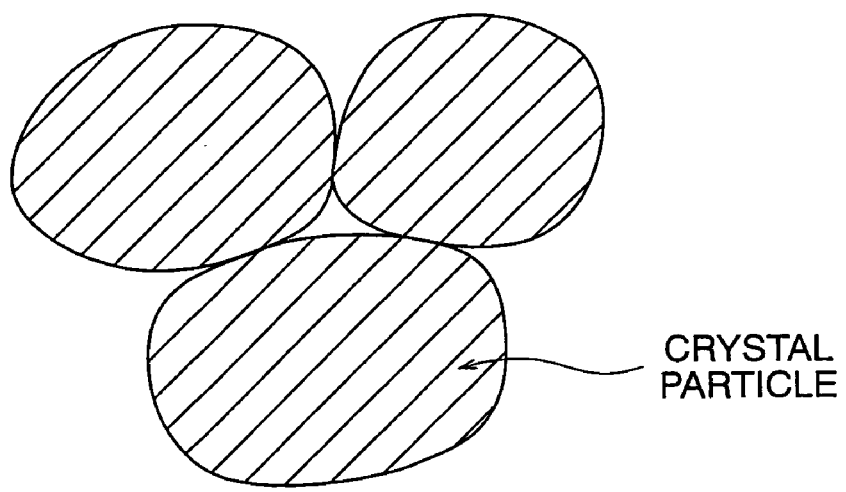
FIG. 6 is a schematic view of the TEM picture in FIG. 4.

FIG. 3 and FIG. 4 show pictures of the fine structure of the crystal particles having the above explained average particle diameter of 0.30 μm observed with a transmission electron microscope (TEM) and FIG. 5 and FIG. 6 show schematic views thereof.

In FIGS. 3 and 5, the dielectric particles (crystal particles) are confirmed to have the core-shell structure that a shell (a subcomponent dispersing layer), wherein subcomponents are dispersed in barium titanate and having uniform thickness, is provided around a core substantially composed of barium titanate as the main component in both cases, however, in FIGS. 4 and 6, the core-shell structure cannot be confirmed.

Then, when considering crystal particles 2a showing an average particle diameter of D50, an average depth T of Ca dispersing area 25a from the surface to the center of the crystal particles were obtained, then, a ratio thereof to said average particle diameter D50 were calculated. The results are shown in Table 1.

Figure 7:
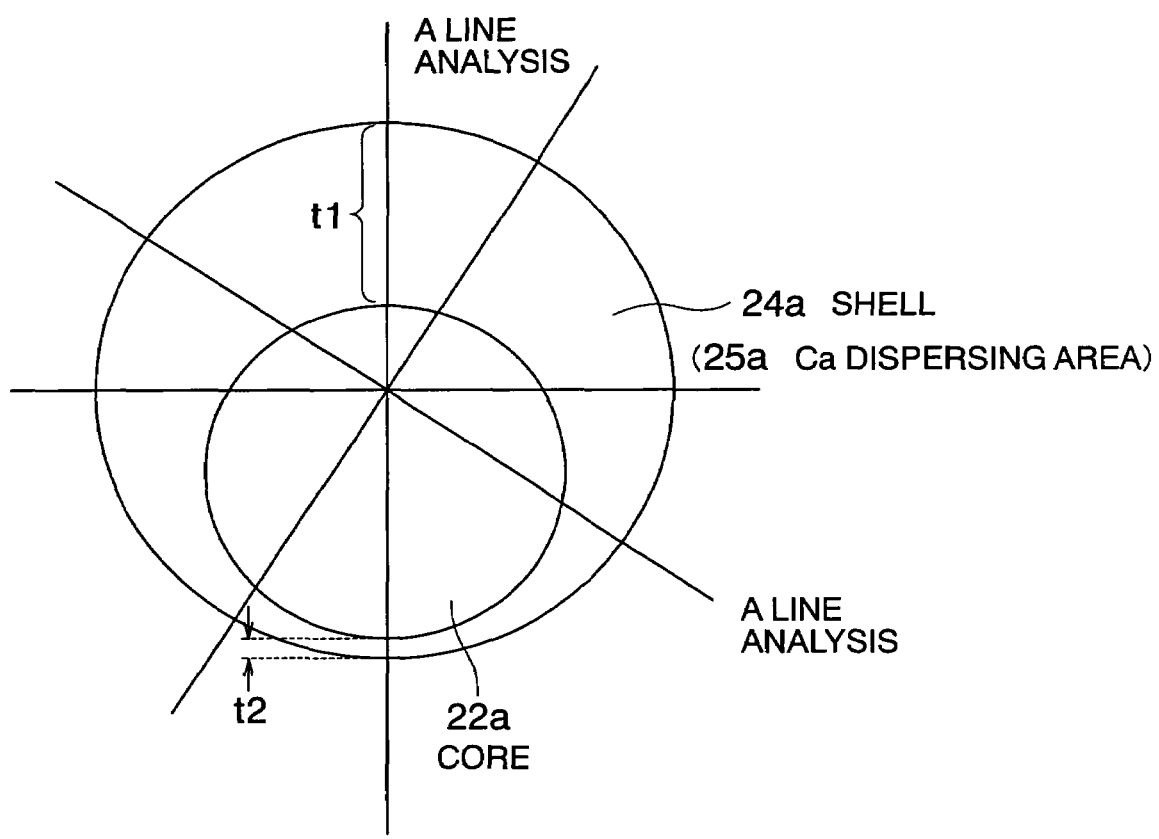
FIG. 7 is a schematic view for explaining a calculation method of an average depth T of Ca dispersing area in an example.

Note that, in the present embodiment, an average depth T of Ca dispersing area 25a were calculated as below. As shown in FIG. 7, a crystal particle having the average particle diameter D50 was subjected to a line analysis with a TEM on a straight line passing the length of the particle through the approximate center thereof, then, another line analysis was made on the same particle by shifting the line by 45 degrees, a depth in the dispersed region was obtained. The analysis was made on n=10 particles and the average value was calculated and determined to be an average depth T of Ca dispersing area 25a.

Considering Ca density distribution as in shell 24, it was confirmed that it disperses within an average thickness of the shell. Note that together with an average depth in Ca dispersing area, an average depth in Mg dispersing area is shown in Table 1. An average depth in Mg dispersing area is a ratio of an average depth from the surface to the center of the crystal particles wherein Mg disperses with respect to D50.

Production of Capacitor Sample

After polishing an end surface of the obtained chip sintered body by sand blast, In—Ga was applied as external electrodes and the multilayer ceramic capacitor shown in FIG. 1 was obtained.

Evaluation of Characteristics of Capacitor Samples

Evaluation was made on a relative permittivity ϵ, temperature characteristic (TC) of the capacitance, and IR temperature reliability (IR changing ratio) of thus obtained capacitor samples, respectively. The results are shown in Table 1.

The relative permittivity ϵ (no unit) was calculated from a capacitance of the obtained capacitor sample measured at a reference temperature of 25° C. with a digital LCR meter (4274A made by YHP) under a condition of a frequency of 1 kHz and an input signal level (measurement voltage) of 1.0 Vrms. Those exhibited 1300 or higher were determined good in the evaluation criteria.

The capacity-temperature characteristic (Tc) was obtained by measuring a capacitance of the obtained samples in a temperature range of −55 to 150° C. A digital LCR meter (4274A made by YHP) was used for measuring the capacitance, and the measurement was made under a condition of a frequency of 1 kHz and an input signal level of 1 Vrms. Then, a capacitance change rate (ΔC/C, the unit is %) was calculated under a temperature environment at 150° C., at which the capacity-temperature characteristic becomes worst in the temperature range, and whether the X8R characteristics (−55 to 150° C. and ΔC/C=within ±15%) were satisfied or not were examined. Those with −15% or higher were determined preferable.

IR temperature dependency (IR changing ratio) was evaluated by measuring insulation resistance $IR_{150}$ at 150° C. and insulation resistance $IR_{25}$ at 25° C. of thus obtained samples and calculating a changing ratio by the following equation (1). Those exhibited −2.00 or higher were determined good in the evaluation criteria.

$$\mathrm{Log}(IR_{150}/IR_{25}) \quad \text{formula (1)}$$

Insulation resistances at each temperature were measured using a temperature changing IR meter at metering voltage of 7.0 V/μm and voltage impressing time of 60 s.

TABLE 1

| | | Ca material | | preliminary firing | | firing | | crystal particles | | capacitor sample | | | |
|---|---|---|---|---|---|---|---|---|---|---|---|---|---|
| Sample No. | kinds | | adding method | holding temperature (° C.) | time (h) | holding temperature (° C.) | time (h) | *an average depth T in Ca dispersing area (%) | *an average depth in Mg dispersing area (%) | capacitance chang rate at 150° C. (%) | X8R | dielectric constant | IR temperature dependency |
| 1 | Ref. Ex. | CaZrO₃ | solid-phase | 700 | 10 | 1240 | 6 | 50(all dissolved) | 17.8 | −20.3 | X | 1320 | −2.78 |
| 2 | Ref. Ex. | CaZrO₃ | solid-phase | 700 | 9 | 1240 | 6 | 40 | 16.7 | −15.9 | X | 1352 | −2.31 |
| 3 | Ex. | CaZrO₃ | solid-phase | 700 | 7 | 1240 | 6 | 30 | 16.5 | −13.8 | ⊚ | 1361 | −1.97 |
| 4 | Ex. | CaZrO₃ | solid-phase | 700 | 5 | 1240 | 6 | 23 | 16.4 | −7.5 | ⊚ | 1382 | −1.78 |

TABLE 1-continued

| Sample No. | Ca material kinds | Ca material adding method | preliminary firing holding temperature (° C.) | preliminary firing time (h) | firing holding temperature (° C.) | firing time (h) | crystal particles *an average depth T in Ca dispersing area (%) | crystal particles *an average depth in Mg dispersing area (%) | capacitor sample capacitance change rate at 150° C. (%) | X8R | capacitor sample dielectric constant | IR temperature dependency |
|---|---|---|---|---|---|---|---|---|---|---|---|---|
| 5 | Ex. CaZrO₃ | solid-phase | 700 | 3 | 1240 | 6 | 10 | 16.3 | −13.9 | ⊙ | 1395 | −1.87 |
| 6 | Ref. Ex. CaZrO₃ | solid-phase | 700 | 1 | 1240 | 6 | 7.8 | 15.9 | −15.6 | X | 1400 | −2.22 |
| 7 | Ref. Ex. CaZrO₃ | solid-phase | 700 | 0 | 1240 | 6 | 5 | 14.3 | −17.8 | X | 1420 | −2.34 |

"*an average depth T in Ca dispersing area" is a percentage with respect to D50 which is an average particle diameter of crystal particles 2a.
"*an average depth in Mg dispersing area" is a percentage with respect to D50 which is an average particle diameter of crystal particles 2a.

As shown in Table 1, when the average depth in Ca dispersion area exceeds 30%, the dielectric constant is sufficient but the temperature characteristic does not satisfy the X8R, moreover, an improvement of IR changing ratio (IR changing ratio of more than −2.00) cannot be seen. When the average depth in the Ca dispersing area is less than 10%, the dielectric constant is sufficient and the temperature characteristic satisfies the X8R, but the relative permittivity ε becomes 1300 or smaller and an improvement of IR changing ratio (IR changing ratio of more than −2.00) cannot be seen.

On the other hand, it was confirmed that when the average depth in the Ca dispersing area was in the range of the present invention (10 to 30%), the dielectric constant was high, the temperature characteristic satisfied the X8R and, moreover, an improvement of IR changing ratio (IR changing ratio of −2.00 or more) could be seen.

Note that an average depth in Mg dispersing area of thus obtained samples were almost the same. This shows that an average depth in Mg dispersing area does not effect an improvement of IR temperature dependency.

Example 2

Other than using CaCO₃Ca—Y—Si—O as Ca material, capacitor samples were produced in the same way as that in the sample 4 of the example 1 and the same evaluation as that in the example 1 was made. The results are shown in Table 2.

TABLE 2

| Sample No. | Ca material kinds | Ca material adding method | preliminary firing holding temperature (° C.) | preliminary firing time (h) | firing holding temperature (° C.) | firing time (h) | crystal particles *an average depth T in Ca dispersing area (%) | crystal particles *an average depth in Mg dispersing area (%) | capacitor sample capacitance change rate at 150° C. (%) | X8R | capacitor sample dielectric constant | IR temperature dependency |
|---|---|---|---|---|---|---|---|---|---|---|---|---|
| 11 | Ex. CaCO₃ | solid-phase | 700 | 5 | 1240 | 6 | 30 | 16.4 | −8.9 | ⊙ | 1350 | −1.87 |
| 4 | Ex. CaZrO₃ | solid-phase | 700 | 5 | 1240 | 6 | 23 | 16.4 | −7.5 | ⊙ | 1326 | −1.78 |
| 12 | Ex. Ca—Y—Si—O | solid-phase | 700 | 5 | 1240 | 6 | 21 | 16.4 | −6.7 | ⊙ | 1340 | −1.67 |

"*an average depth T in Ca dispersing area" is a percentage with respect to D50 which is an average particle diameter of crystal particles 2a.
"*an average depth in Mg dispersing area" is a percentage with respect to D50 which is an average particle diameter of crystal particles 2a.

As shown in Table 2, it was confirmed that the average depth in Ca dispersing area was in the range of the present invention (10 to 30%) in all samples and the same results could be obtained.

Example 3

Other than changing the firing time to 0.5 hour, 2 hours, 15 hours, and 30 hours, capacitor samples were produced in the same way as that in the sample 4 (firing time of 6 hours) of the example 1 and the same evaluation as that in the example 1 was made. The results are shown in Table 3.

TABLE 3

| Sample No. | | Ca material | | preliminary firing | | firing | | crystal particles | | capacitor sample | | | | |
|---|---|---|---|---|---|---|---|---|---|---|---|---|---|---|
| | | kinds | adding method | holding temperature (° C.) | time (h) | holding temperature (° C.) | time (h) | *an average depth T in Ca dispersing area (%) | *an average depth in Mg dispersing area (%) | capacitance chang rate at 150° C. (%) | X8R | dielectric constant | IR temperature dependency | |
| 21 | Ref. Ex. | $CaZrO_3$ | solid-phase | 700 | 5 | 1240 | 30 | 43.1 | 18.1 | −20.1 | X | 1326 | −2.46 | |
| 22 | Ex. | $CaZrO_3$ | solid-phase | 700 | 5 | 1240 | 15 | 27.6 | 16.9 | −12.1 | ⊚ | 1356 | −1.85 | |
| 4 | Ex. | $CaZrO_3$ | solid-phase | 700 | 5 | 1240 | 6 | 23 | 16.4 | −7.5 | ⊚ | 1382 | −1.78 | |
| 23 | Ex. | $CaZrO_3$ | solid-phase | 700 | 5 | 1240 | 2 | 12.1 | 15.9 | −12.7 | ⊚ | 1400 | −1.75 | |
| 24 | Ref. Ex. | $CaZrO_3$ | solid-phase | 700 | 5 | 1240 | 0.5 | 4.5 | 14.3 | −18.9 | X | 1410 | −2.11 | |

"*an average depth T in Ca dispersing area" is a percentage with respect to D50 which is an average particle diameter of crystal particles 2a.
"*an average depth in Mg dispersing area" is a percentage with respect to D50 which is an average particle diameter of crystal particles 2a.

As shown in Table 3, it was confirmed that when the firing time gets longer, the an average depth in Ca dispersing area increases, while an average depth in Mg area does not vary. Further, when the firing time exceeds 15 hours, an average depth in Ca dispersing area exceeds 30%, while when less than 2 hours, the average depth in Ca dispersing area became less than 5%, and an improvement in IR changing ratio could not be seen in either cases. On the other hand, when the firing time is 2 to 15 hours, an average depth in Ca dispersing area was within a range (10 to 30%) of the invention and an improvement could be seen in IR changing ratio.

Example 4

Other than a liquid-phase addition of Ca material, capacitor samples were produced in the same way as that in the sample 4 (a solid-phase addition) of the example 1 and the same evaluation as that in the example 1 was made.

Ca material liquid-phase addition was done by preparing Ca organic metal salt, solving it in ethyl acetate solution, and then, adding it in the paste. The results are shown in Table 4.

TABLE 4

| Sample No. | | Ca material | | preliminary firing | | firing | | crystal particles | | capacitor sample | | | | |
|---|---|---|---|---|---|---|---|---|---|---|---|---|---|---|
| | | kinds | adding method | holding temperature (° C.) | time (h) | holding temperature (° C.) | time (h) | *an average depth T in Ca dispersing area (%) | *an average depth in Mg dispersing area (%) | capacitance chang rate at 150° C. (%) | X8R | dielectric constant | IR temperature dependency | |
| 4 | Ex. | $CaZrO_3$ | solid-phase | 700 | 5 | 1240 | 6 | 23 | 16.4 | −7.5 | ⊚ | 1350 | −1.78 | |
| 31 | Ex. | $CaZrO_3$ | liquid-phase | 700 | 5 | 1240 | 6 | 22.1 | 16.7 | −7.4 | ⊚ | 1363 | −1.79 | |

"*an average depth T in Ca dispersing area" is a percentage with respect to D50 which is an average particle diameter of crystal particles 2a.
"*an average depth in Mg dispersing area" is a percentage with respect to D50 which is an average particle diameter of crystal particles 2a.

As shown in Table 4, samples which Ca material is added with a liquid-phase, it was confirmed that the average depth in Ca dispersing area was within the range of the present invention (10 to 30%) in all samples and the same results could be obtained.

What is claimed is:

1. A dielectric ceramic composition comprising a main component including barium titanate, and a subcomponent including at least Mg and Ca, wherein a plural number of crystal particles are included in the dielectric ceramic composition, said crystal particles are provided with Ca dispersing area wherein at least said Ca is dispersed from the surface to inside of crystal particles, and when considering crystal particles having an average particle diameter of D50, an average depth T of said Ca dispersing area is controlled within a range of 10 to 30% with respect to the average particle diameter of D50.

2. A dielectric ceramic composition comprising a main component including barium titanate a first subcomponent selected at least one kind from MgO, CaO, BaO and SrO, a second subcomponent comprising silicone oxide as main component, a third subcomponent comprising at least one kind from $V_2O_5$, $MoO_3$ and $WO_3$, a fourth subcomponent comprising R1 oxide wherein R1 is selected from at least one of Sc, Er, Tm, Yb, and Lu, a fifth subcomponent comprising $CaZrO_3$ or $CaO+ZrO_2$, a sixth subcomponent comprising R2 oxide wherein R2 is selected from at least one of Y, Dy, Ho, Tb, Gd, and Eu, and
a seventh subcomponent comprising MnO
wherein ratios of the respective subcomponents with respect to 100 moles of said main component are
the first subcomponent: 0.1 to 3 moles,
a second subcomponent: 2 to 10 moles,
a third subcomponent: 0.01 to 0.5 mole,
a fourth subcomponent: 0.5 to 7 moles wherein the number of moles of the fourth subcomponent is a ratio of R1 alone,
a fifth subcomponent: 0<the fifth subcomponent≦5 moles,
a sixth subcomponent: 9 moles or less wherein the number of moles of the sixth subcomponent is a ratio of R2 alone,
a seventh subcomponent: 0.5 mole or less, and
a plural number of crystal particles are included in the dielectric ceramic composition,
said crystal particles are formed with Ca dispersing area wherein at least said Ca is dispersed from the surface to inside of crystal particles,
and when considering crystal particles having an average particle diameter of D50, an average depth T of Ca dispersing area is controlled within a range of 10 to 30% with respect to the average particle diameter of D50.

3. A dielectric ceramic composition comprising
a main component including barium titanate,
a first subcomponent comprising AE oxide wherein AE is selected from at least one of Mg, Ca, Ba, and Sr,
a second subcomponent comprising R oxide wherein R is selected from at least one of Y, Dy, Tm, Ho, and Er,
a third subcomponent comprising $M_xSiO_3$ wherein M is selected from at least one of Ba, Ca, Sr, Li, B and when M=Ba, X=1, when M=Ca, X=1, when M=Sr, X=1, when M=Li, X=2, when M=B, X=2/3 respectively,
a fourth subcomponent comprising MnO,
a fifth subcomponent comprising at least one $V_2O_5$, $MoO_3$, and $WO_3$, and
a sixth subcomponent comprising $CaZrO_3$ or $CaO+ZrO_2$
wherein ratios of the respective subcomponents with respect to 100 moles of said main component are
the first subcomponent: 0 to 0.1 mole wherein 0 mole and 0.1 mole are excluded,
the second subcomponent: 1 to 7 moles wherein 1 mole and 7 moles are excluded,
the third subcomponent: 2 to 10 moles,
the fourth subcomponent: 0 to 0.5 mole wherein 0 mole is excluded,
the fifth subcomponent: 0.01 to 0.5 mole,
the sixth subcomponent: 0 to 5 moles wherein 0 mole and 5 moles are excluded, and
a plural number of crystal particles are included in the dielectric ceramic composition,
said crystal particles are provided with Ca dispersing area wherein at least said Ca is dispersed from the surface to inside of particles,
and when considering crystal particles having an average particle diameter of D50, an average depth T of said Ca dispersing area is controlled within a range of 10 to 30% with respect to the average particle diameter of D50.

4. An electronic device comprising a dielectric layer composed of a dielectric ceramic composition, wherein:
said dielectric ceramic composition is composed of the dielectric ceramic composition as set forth in claim 1.

5. A multilayer ceramic capacitor comprising a capacitor element body, wherein dielectric layers composed of a dielectric ceramic composition and internal electrode layers are alternately stacked, wherein:
said dielectric ceramic composition is composed of the dielectric ceramic composition as set forth in claim 1.

6. An electronic device comprising a dielectric layer composed of a dielectric ceramic composition, wherein:
said dielectric ceramic composition is composed of the dielectric ceramic composition as set forth in claim 2.

7. An electronic device comprising a dielectric layer composed of a dielectric ceramic composition, wherein:
said dielectric ceramic composition is composed of the dielectric ceramic composition as set forth in claim 3.

8. A multilayer ceramic capacitor comprising a capacitor element body, wherein dielectric layers composed of a dielectric ceramic composition and internal electrode layers are alternately stacked, wherein:
said dielectric ceramic composition is composed of the dielectric ceramic composition as set forth in claim 2.

9. A multilayer ceramic capacitor comprising a capacitor element body, wherein dielectric layers composed of a dielectric ceramic composition and internal electrode layers are alternately stacked, wherein:
said dielectric ceramic composition is composed of the dielectric ceramic composition as set forth in claim 3.

* * * * *